US007770089B2

(12) United States Patent
Eroz et al.

(10) Patent No.: US 7,770,089 B2
(45) Date of Patent: Aug. 3, 2010

(54) METHOD AND APPARATUS FOR PROVIDING REDUCED MEMORY LOW DENSITY PARITY CHECK (LDPC) CODES

(75) Inventors: Mustafa Eroz, Germantown, MD (US); Feng-Wen Sun, Germantown, MD (US); Lin-Nan Lee, Potomac, MD (US)

(73) Assignee: DTVG Licensing, Inc., El Segundo, CA (US)

( * ) Notice: Subject to any disclaimer, the term of this patent is extended or adjusted under 35 U.S.C. 154(b) by 678 days.

(21) Appl. No.: 11/805,616

(22) Filed: May 24, 2007

(65) Prior Publication Data

US 2007/0226578 A1 Sep. 27, 2007

(51) Int. Cl.
H03M 13/00 (2006.01)
(52) U.S. Cl. ...................... 714/758; 714/801
(58) Field of Classification Search ................. 714/758, 714/801
See application file for complete search history.

(56) References Cited

U.S. PATENT DOCUMENTS

| | | | |
|---|---|---|---|
| 6,633,856 B2 * | 10/2003 | Richardson et al. | 706/15 |
| 6,789,227 B2 * | 9/2004 | De Souza et al. | 714/804 |
| 6,895,547 B2 * | 5/2005 | Eleftheriou et al. | 714/801 |
| 7,000,174 B2 * | 2/2006 | Mantha et al. | 714/790 |
| 2002/0051501 A1 * | 5/2002 | Demjanenko et al. | 375/298 |
| 2003/0037298 A1 | 2/2003 | Eleftheriou et al. | |
| 2003/0126551 A1 * | 7/2003 | Mantha et al. | 714/790 |

OTHER PUBLICATIONS

Calzolari, Gian Paolo; "Report on DVB-S2 Channel 1-16 Coding Standardization Effort"; CCSDS Sub-Panel 1B Channel Coding; Spring 2003 Meeting; Matera, Italy; Apr. 7, 2003; pp. 1-11; XP002311762.
ETSI: "Digital Video Broadcasting (DVB) Second Generation Framing Structure, Channel Coding and Modulation Systems for Broadcasting, Interactive Services, News Gathering and Other Broadband Satellite Applications"; Draft ETSI EN 302 307 V1.1.1; Jun. 2004; pp. 1-74; XP002311764.
Lee, Lin-Nan; "Application to Next Generation Communication Systems"; Hughes Network Systems; Oct. 8, 2003; pp. 1-8; XP-002311763.
EPO summons to attend oral proceedings dated Mar. 5, 2009 in European patent Application No. 04256630.7 filed Oct. 27, 2004 by Mustafa Eroz et al.

* cited by examiner

*Primary Examiner*—M. Mujtaba K Chaudry

(57) ABSTRACT

An approach is provided for generating Low Density Parity Check (LDPC) codes. An LDPC encoder generates a LDPC code with an outer Bose Chaudhuri Hocquenghem (BCH) code. For a rate 3/5 code, the approach provides a degree profile that yields reduced memory requirements for storage of the edge values without significantly affecting the performance with respect to an "unmodified" rate 3/5 code. The relevant parameters for the reduced memory LDPC codes are as follows: $q=72$, $n_{ldpc}=64800$, $k_{ldpc}=n_{BCH}=38880$, $k_{BCH}=38688$. The above approach has particular application in digital video broadcast services over satellite.

19 Claims, 7 Drawing Sheets

$$H = \begin{bmatrix} n_1 & n_2 & n_3 & n_4 & n_5 & n_6 & n_7 & n_8 \\ 1 & 0 & 1 & 1 & 1 & 0 & 0 & 1 \\ 0 & 1 & 0 & 0 & 1 & 1 & 0 & 0 \\ 1 & 0 & 1 & 0 & 0 & 1 & 1 & 1 \\ 0 & 1 & 0 & 1 & 0 & 1 & 1 & 0 \end{bmatrix} \begin{matrix} m_1 \\ m_2 \\ m_3 \\ m_4 \end{matrix}$$

$$B = \begin{bmatrix} 1 & x & x & x & x & x & x \\ x & 1 & x & x & x & x & x \\ & & 1 & x & x & x & x \\ & & & 1 & x & x & x \\ & & \mathbf{0} & & 1 & x & x \\ & & & & & 1 & x \\ & & & & & & 1 \end{bmatrix}$$

METHOD AND APPARATUS FOR PROVIDING REDUCED MEMORY LOW DENSITY PARITY CHECK (LDPC) CODES

RELATED APPLICATIONS

This application is related to, and claims the benefit of the earlier filing date under 35 U.S.C. §119(e) of U.S. Provisional Application Ser. No. 60/514,680 filed Oct. 27, 2003, titled "Reduced Memory Rate 3/5 LDPC Code"; the entirety of which is incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. For example, in a wireless (or radio) system, such as a satellite network, noise sources abound, from geographic and environmental factors. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. This objective is particularly germane to bandwidth constrained satellite systems. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Length LDPC codes, thus, require greater storage space. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding.

SUMMARY OF THE INVENTION

These and other needs are addressed by the present invention, wherein an approach for encoding Low Density Parity Check (LDPC) codes is provided. An encoder generates a LDPC code having an outer Bose Chaudhuri Hocquenghem (BCH) code according to Table 1 for transmission as the LDPC coded signal. Specifically, for a rate 3/5 code, Table 1 provides a degree profile that yields reduced memory requirements for storage of the edge values without significantly affecting the performance with respect to an "unmodified" rate 3/5 code. The approach advantageously provides expedient encoding as well as decoding of LDPC codes, while minimizing storage and processing resources.

According to another aspect of an embodiment of the present invention, the LDPC codes are represented by signals that are modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

According to yet another aspect of an embodiment of the present invention, the modulated LDPC coded signal is transmitted over a satellite link in support of a broadband satellite application.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

An apparatus, method, and software for encoding rate 3/5 Low Density Parity Check (LDPC) codes with reduced memory requirement are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
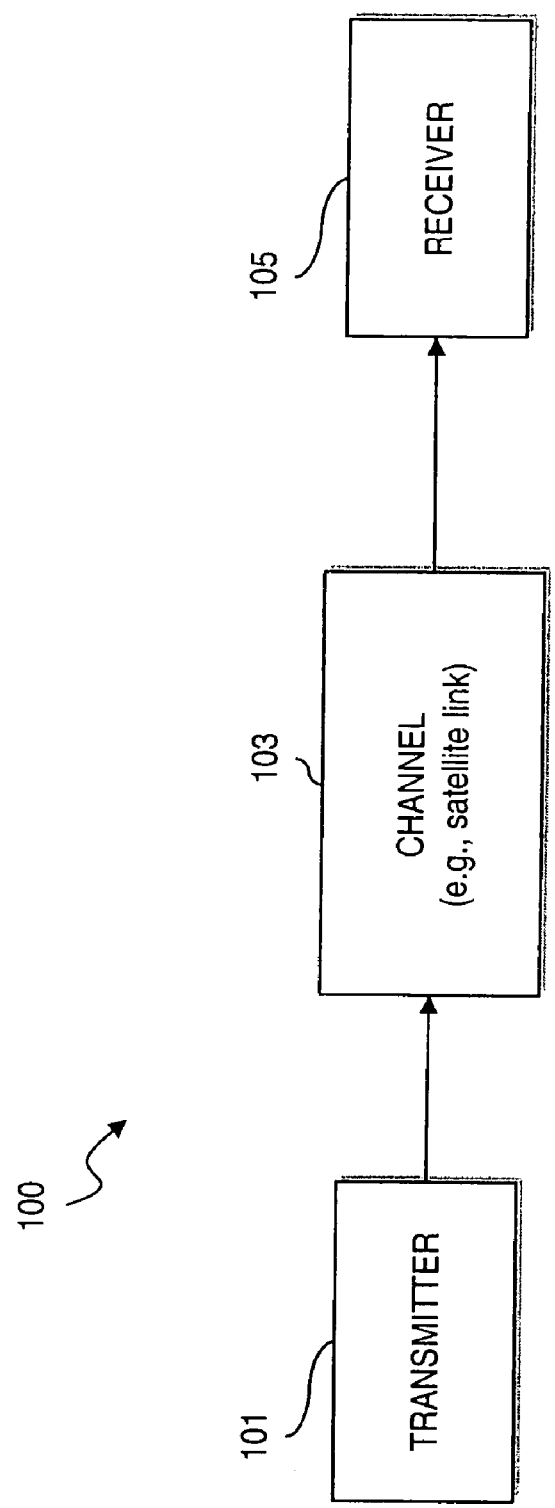
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise in the channel 103, LDPC codes are utilized.

By way of example, the channel 103 is a satellite link serving satellite terminals (e.g., Very Small Aperture Terminals (VSATs)) in support of broadband satellite applications. Such applications include satellite broadcasting and interactive services (and compliant with the Digital Video Broadcast (DVB)-S2 standard). The Digital Video Broadcasting via Satellite (DVB-S) standard has been widely adopted worldwide to provide, for instance, digital satellite television programming.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-Phase Shift Keying (PSK)).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

Figure 2A:
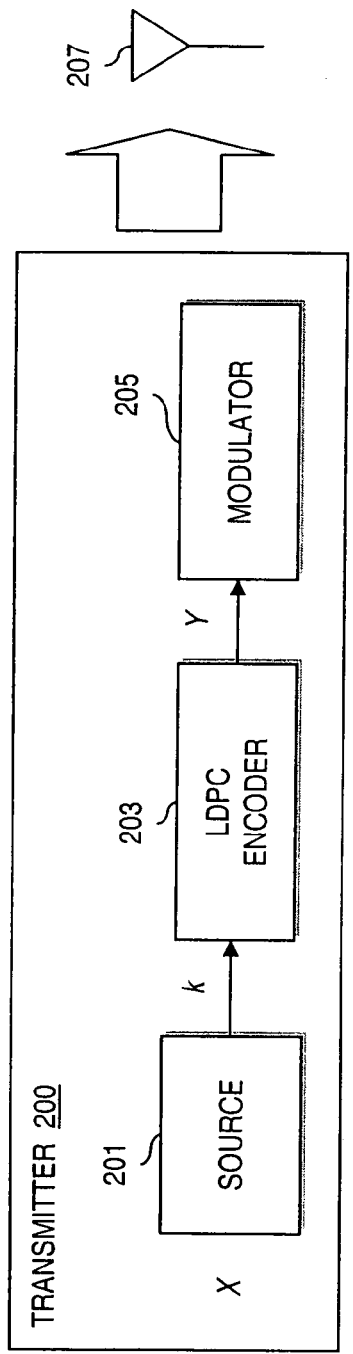
FIGS. 2A and 2B are diagrams of exemplary LDPC encoders deployed in the transmitter of FIG. 1.
Figure 2B:
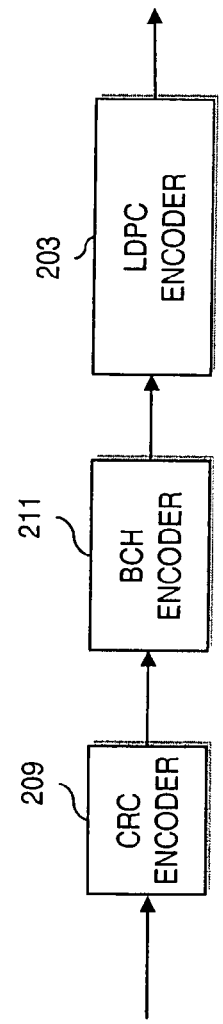

FIGS. 2A and 2B are diagrams of exemplary LDPC encoders deployed in the transmitter of FIG. 1. As seen in FIG. 2A, a transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

The encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

The modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver (shown in FIG. 3), as discussed below.

FIG. 2B shows an LDPC encoder utilized with a Bose Chaudhuri Hocquenghem (BCH) encoder and a cyclic redundancy check (CRC) encoder, according to one embodiment of the present invention. Under this scenario, the codes generated by the LDPC encoder 203, along with the CRC encoder 209 and the BCH encoder 211, have a concatenated outer BCH code and an inner low density parity check (LDPC) code. Furthermore, error detection is achieved using cyclic redundancy check (CRC) codes. The CRC encoder 209, in an exemplary embodiment, encodes using an 8-bit CRC code with generator polynomial $(x^5+x^4+x^3+x^2+1)(x^2+x+1)(x+1)$. The CRC code is output to the BCH encoder 211.

Figure 2C:
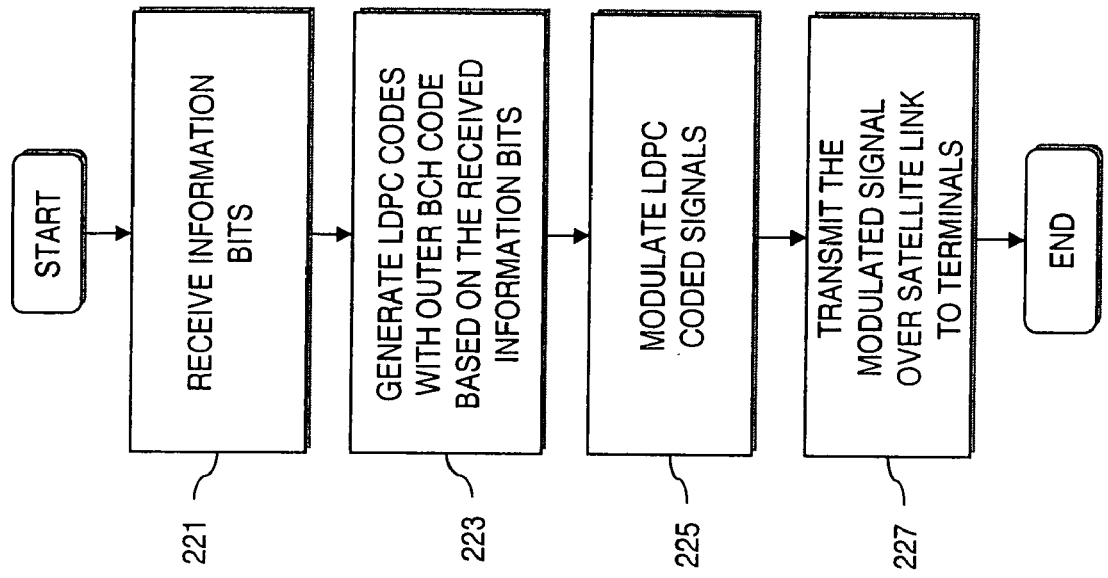
FIG. 2C is a flowchart of the encoding process of the LDPC encoder of FIG. 2B for generating LDPC codes, according to an embodiment of the present invention.

FIG. 2C is a flowchart of the encoding process of the LDPC encoder of FIG. 2B for generating long frame length LDPC codes, according to an embodiment of the present invention. In step 221, information bits are received and processed to the chain of encoders 209, 211, and 203. Consequently, the LDPC encoder 203 generates LDPC codes with outer BCH codes based on the received information bits, as in step 223. The codes also contain the CRC code. Next, the LDPC codes are represented by signals that are modulated, per step 225, for transmission over the channel 103, which in an exemplary embodiment, is a satellite link to one or more satellite terminals (step 227).

The LDPC encoder 203 systematically encodes an information block of size $k_{ldpc}$, $i=(i_0,i_1,\ldots,i_{k_{ldpc}-1})$ onto a codeword of size $n_{ldpc}$, $c=(i_0,i_1,\ldots,i_{k_{ldpc}-1},p_0,p_1,\ldots p_{n_{ldpc}-k_{ldpc}-1})$. The transmission of the codeword starts in the given order from $i_0$ and ends with $p_{n_{ldpc}-k_{ldpc}-1}$ LDPC code parameters $(n_{ldpc},k_{ldpc})$.

The task of the LDPC encoder 203 is to determine $n_{ldpc}-k_{ldpc}$ parity bits $(p_0,p_1,\ldots,p_{n_{ldpc}-k_{ldpc}-1})$ for every block of $k_{ldpc}$ information bits, $(i_0,i_1,\ldots,i_{k_{ldpc}-1})$. The procedure is as follows. First, the parity bits are initialized; $p_0=p_1=p_2=\ldots=p_{n_{ldpc}-k_{ldpc}-1}=0$. By way of example, $k_{ldpc}$ bits are systematically encoded to generate $n_{ldpc}$ bits. For the 3/5 rate code of Table 1, the relevant parameters are as follows: q=72, $n_{ldpc}$=64800, $k_{ldpc}$=$n_{BCH}$=38880, $k_{BCH}$=38688. The code design provides for a degree profile of bit nodes and check nodes (i.e., the number of outgoing edges from the bit (or check) nodes) that result in reduce memory requirements, while retaining the performance of an "unmodified" 3/5 rate code. The reduced memory rate 3/5 code has 12960 bit nodes of degree 8, 25920 bit nodes of degree 3, 25919 bit nodes of degree 2, and 1 bit node of degree 1. This code also has 25919 check nodes of degree 9, and 1 check node of degree 8.

The first information bit, $i_0$, are accumulated at parity bit addresses specified in the first row of Table 1. Accordingly, the following results:

$p_{22407}=p_{22407} \oplus i_0$ $p_{10271}=p_{10271} \oplus i_0$ $p_{19944}=p_{19944} \oplus i_0$ $p_{11218}=p_{11218} \oplus i_0$ $p_{2914}=p_{2914} \oplus i_0$ $p_{3149} = p_{3149} \oplus i_0$ $p_{73} = p_{73} \oplus i_0$ In the above equations, the additions are in GF(2)).

Then, for the next 359 information bits, $i_m$, m=1,2,...,359, these bits are accumulated at parity bit addresses {x+m mod 360×q} mod($n_{ldpc}-k_{ldpc}$), where x denotes the address of the parity bit accumulator corresponding to the first bit $i_0$, and q is a code rate dependent constant. Continuing with the example, q=72 for rate 3/5, for information bit $i_1$, the following operations are performed:

$p_{22479} = p_{22479} \oplus i_1$ $p_{10343} = p_{10343} \oplus i_1$ $p_{20016} = p_{20016} \oplus i_1$ $p_{11290} = p_{11290} \oplus i_1$ $p_{2986} = p_{2986} \oplus i_1$ $p_{3221} = p_{3221} \oplus i_1$ $p_{145} = p_{145} \oplus i_1$ For the 361$^{st}$ information bit $i_{360}$, the addresses of the parity bit accumulators are given in the second row of the Table 1. In a similar manner the addresses of the parity bit accumulators for the following 359 information bits $i_m$, m=361,362,...,719 are obtained using the formula {x+m mod 360×q} mod ($n_{ldpc}-k_{ldpc}$), where x denotes the address of the parity bit accumulator corresponding to the information bit $i_{360}$, i.e., the entries in the second row of the Table 1. In a similar manner, for every group of 360 new information bits, a new row from Table 1 is used to find the addresses of the parity bit accumulators.

TABLE 1

Address of Parity Bit Accumulators (Rate 3/5)

22407 10271 11614 19944 11218 2914 3149 73
15405 9692 9911 3315 343 22463 11100 12704
22561 17290 22501 6471 6935 8761 13279 8911
11053 22855 25752 14337 5499 19226 8772 2187
7750 7477 6155 7039 15401 20623 11950 16146
25376 5191 15926 21804 17531 11820 21622 12048
16555 14530 7636 10699 17439 11098 5675 14131
10381 22342 15382 7062 17440 13122 14500 24536
1041 15025 25372 14243 24448 21620 23701 7474
18504 22194 20916 8948 5461 15657 6146 21549
24143 2676 23993 24376 22472 10350 1079 12342
23825 9004 25634 16833 5736 18814 11600 5591
21494 24795 6352 17362 7102 13903 3993 16495
11561 15038 23349 503 3497 11202 15418 16076
22528 2432 19064 2934 21660 1911 7499 5616
7283 16543 13866 6723 8888 18245 16962 1743
2727 16421 728 10651 7012 9191 10149 9106
13005 10331 15275 3145 13413 12800 17139 4932
4504 15820 24833 17200 14077 4993 9788 6653
18224 11374 9038 4713 510 9369 7421 8337
23906 18930 7269 12514 4373 20020 6164 21016
4406 8242 22946 25140 10353 5300 14809 5808
15911 16437 15764 17765 17427 9495 8358 4961
2131 12908 5343 14758 14678 7988 20631 4357
24002 10014 11034 3773 24265 8059 19802 854
23920 10497 19268 17515 6333 7787 17171 17614
15810 7467 23718 3651 24578 16552 17557 22433
20507 4411 24872 11006 17541 15667 15278 4243
24148 10488 8501 23359 4030 1418 4442 23299
16584 8067 24762 3645 25884 8712 9585 20358
10710 6116 24519 7728 19963 24989 23944 13660
18708 145 3901 22948 16454 17670 15352 18189
3218 11549 18170 12733 18733 5705 14682 17199

TABLE 1-continued

Address of Parity Bit Accumulators (Rate 3/5)

14921 11190 25097 23569 86 4804 10478 22553
657 53 15215 15049 13307 2328 19535 21435
19767 2988 16855 4858 23970 15171 724 23353
0 19274 20228
1 13271 1515
2 10864 476
3 4787 21317
4 2609 15664
5 23875 22477
6 9537 18270
7 12039 16705
8 15180 18317
9 10133 6682
10 10203 5671
11 12482 13992
12 191161 725
13 17558 16333
14 7932 18883
15 23346 6770
16 5049 15145
17 6960 8821
18 10686 16411
19 14276 4043
20 6988 1073
21 20504 4318
22 14806 18855
23 23408 2829
24 22876 24662
25 14159 10002
26 8898 25354
27 5936 1007
28 16162 7228
29 23710 23342
30 23745 16423
31 13336 18903
32 10697 8815
33 6198 6723
34 2880 20781
35 11857 24611
36 8005 2292
37 24679 6248
38 21841 20646
39 11296 9870
40 21935 16106
41 10983 18735
42 12821 12188
43 13941 10895
44 5712 19077
45 6437 11275
46 10827 11446
47 14047 13073
48 1503 19612
49 17944 1338
50 11235 24946
51 19170 7268
52 2913 2560
53 17734 7765
54 9625 22307
55 17651 16905
56 300 3636
57 1526 23116
58 17733 2448
59 14977 13008
60 11946 12026
61 8819 8702
62 11906 4819
63 2629 12075
64 4854 5201
65 13627 18773
66 18658 12753
67 24872 8887
68 3455 8326
69 10772 3134
70 21514 18584
71 15689 18484

After all of the information bits are exhausted, the final parity bits are obtained as follows. First, the following operations are performed, starting with i=1

$$p_i = p_i \oplus p_{i-1}, i=1,2,\ldots,n_{ldpc}-k_{ldpc}-1.$$

Final content of $p_i$, $i=0,1,\ldots,n_{ldpc}-k_{ldpc}-1$ is equal to the parity bit $p_i$.

After all of the information bits are exhausted, the final parity bits are obtained as follows. First, the following operations are performed, starting with i=1

$$p_i = p_i \oplus p_{i-1}, i=1,2,\ldots,n_{ldpc}-k_{ldpc}-1.$$

Final content of $p_i$, $i=0,1,\ldots,n_{ldpc}-k_{ldpc}-1$ is equal to the parity bit $p_i$.

As regards BCH encoding, according to one embodiment of the present invention, the generator polynomial of the BCH code utilized by the BCH encoder 211 is as follows:

$$\begin{aligned}g(x)=&(1+x+x^3+x^5+x^{14})\times(1+x^6+x^8+x^{11}+x^{14})\times(1+x+x^2+\\&x^6+x^9+x^{10}+x^{14})\times(1+x^4+x^7+x^8+x^{10}+x^{12}+x^{14})\times(1+\\&x^2+x^4+x^6+x^8+x^9+x^{11}+x^{13}+x^{14})\times(1+x^3+x^7+x^8+x^9+\\&x^{13}+x^{14})\times(1+x^2+x^5+x^6+x^7+x^{10}+x^{11}+x^{13}+x^{14})\times(1+\\&x^5+x^8+x^9+x^{10}+x^{11}+x^{14})\times(1+x+x^2+x^3+x^9+x^{10}+\\&x^{14})\times(1+x^3+x^6+x^9+x^{11}+x^{12}+x^{14})\times(1+x^4+x^{11}+x^{12}+\\&x^{14})\times(1+x+x^2+x^3+x^5+x^6+x^7+x^8+x^{10}+x^{13}+x^{14}).\end{aligned}$$

BCH encoding of information bits $m=(m_{k_{bch}-1}, m_{k_{bch}-2}, \ldots, m_1, m_0)$ onto a codeword $c=(m_{k_{bch}-1}, m_{k_{bch}-2}, \ldots, m_1, m_0, d_{n_{bch}-k_{bch}-1}, d_{n_{bch}-k_{bch}-2}, \ldots, d_1, d_0)$ is achieved as follows. The message polynomial $m(x) = m_{k_{bch}-1} x^{k_{bch}-1} + m_{k_{bch}-2} x^{k_{bch}-2} + \ldots + m_1 x + m_0$ is multiplied by $x^{n_{bch}-k_{bch}}$. Next, $x^{n_{bch}-k_{bch}} m(x)$ divided by g(x). With $d(x) = d_{n_{bch}-k_{bch}-1} x^{n_{bch}-k_{bch}-1} + \ldots + d_1 x + d_0$ as the remainder, the codeword polynomial is set as follows: $c(x) = x^{n_{bch}-k_{bch}} m(x) + d(x)$.

The above approach to designing LDPC codes, as provided in Table 1, advantageously permits storage and retrieval of relevant information regarding partitioned groups of bit nodes and check nodes to be always placed in contiguous memory locations within memory (e.g., Random Access Memory (RAM)). Consequently, multiple code rates can be supported without employing different decoders. Further, the design enables use of a single RAM bank, thereby minimizing size of the integrated circuit. As mentioned, the above LDPC codes, in an exemplary embodiment, can be used to variety of digital video applications, such as MPEG (Motion Pictures Expert Group) packet transmission.

Figure 3:
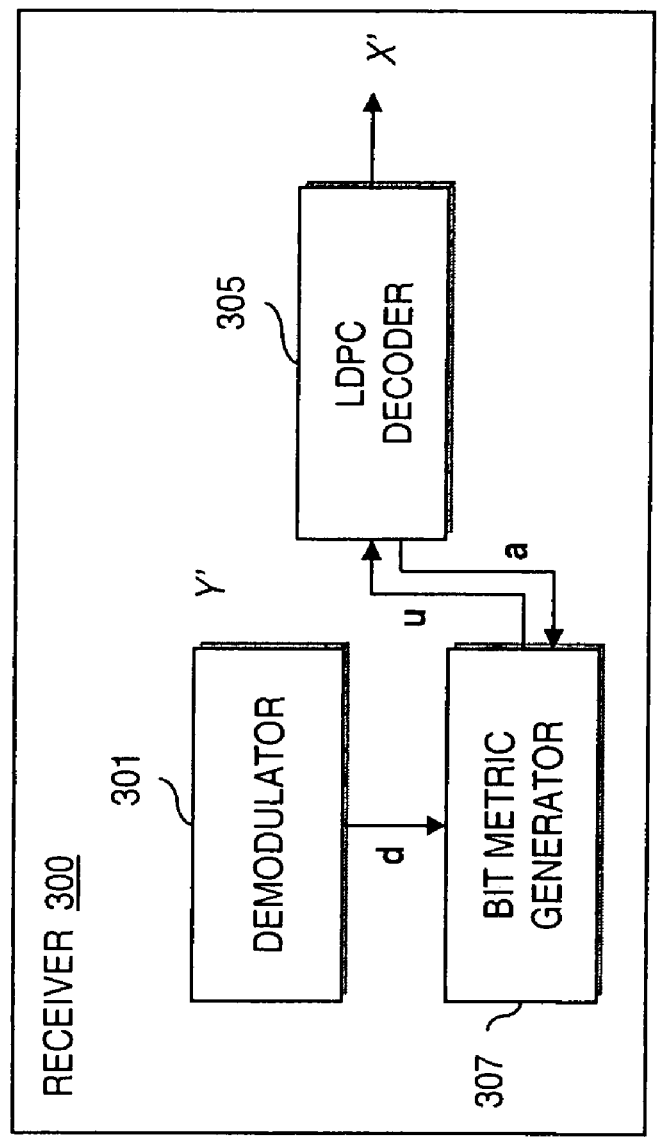
FIG. 3 is a diagram of an exemplary receiver in the system of FIG. 1.
Figure 3:
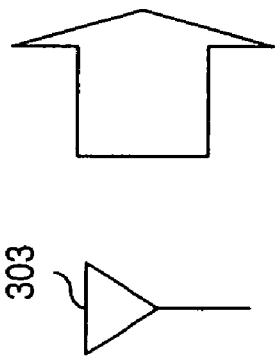

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a LDPC decoder 305, which attempts to reconstruct the original source messages by generating messages, X', in conjunction with a bit metric generator 307. The bit metric generator 307 may exchange information with the decoder 305 back and forth (iteratively) during the decoding process. These decoding approaches are more fully described in co-pending application, entitled "Method and System for Routing in Low Density Parity Check (LDPC) Decoders," filed Jul. 3, 2003 (Ser. No. 10/613,824; which is incorporated herein in its entirety. It is noted that LDPC codes, as constructed per Table 1, can support multiple code rates (consequently, multiple data rates) using a common decoding architecture; in contrast, convolutional codes, for example, require puncturing techniques to achieve intermediate rates.

Figures 4, 5, 6:
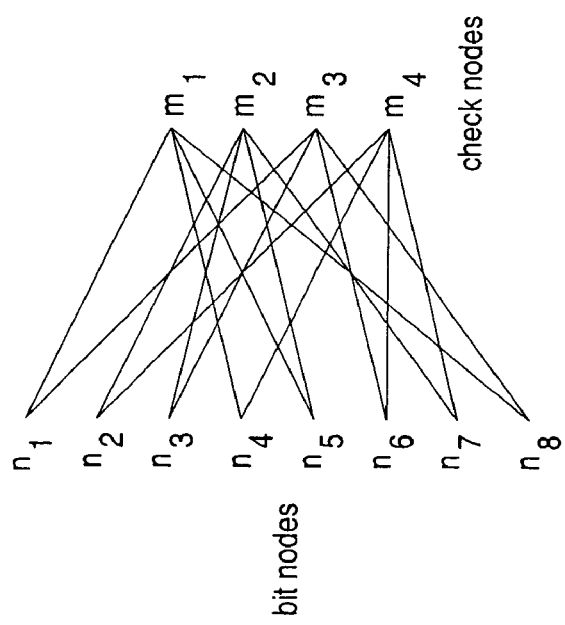
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

To further appreciate the advantages offered by the present invention, it is instructive to examine how LDPC codes are generated, as discussed in FIG. 4.

FIG. 4 is a diagram of a sparse parity check matrix, in accordance with an embodiment of the present invention.

LDPC codes are long, linear block codes with sparse parity check matrix $H_{(n-k)\times n}$. Typically the block length, n, ranges from thousands to tens of thousands of bits. For the purposes of explanation, a parity check matrix for an LDPC code of length n=8 and rate 1/2 is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$ then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIGS. 2A and 2B) can employ a simple encoding technique by restricting the values of the lower triangular area of the parity check matrix. According to an embodiment of the present invention, the restriction imposed on the parity check matrix is of the form:

$$H_{(n-k)\times n} = [A_{(n-k)\times k} B_{(n-k)\times (n-k)}]$$

where B is lower triangular.

Any information block $i=(i_0,i_1,\ldots,i_{k-1})$ is encoded to a codeword $c=(i_0,i_1,\ldots,i_{k-1},p_0,p_1,\ldots p_{n-k-1})$ using $Hc^T=0$, and recursively solving for parity bits; for example, $$a_{00}i_0 + a_{01}i_1 + \ldots + a_{0,k-1}i_{k-1} + p_0 = 0 \Rightarrow \text{Solve } p_0,$$

$$a_{10}i_0 + a_{11}i_1 + \ldots + a_{1,k-1}i_{k-1} + b_{10}p_0 + p_1 = 0 \Rightarrow \text{Solve } p_1$$
and similarly for $p_2, p_3, \ldots, p_{n-k-1}$.

Figure 7:
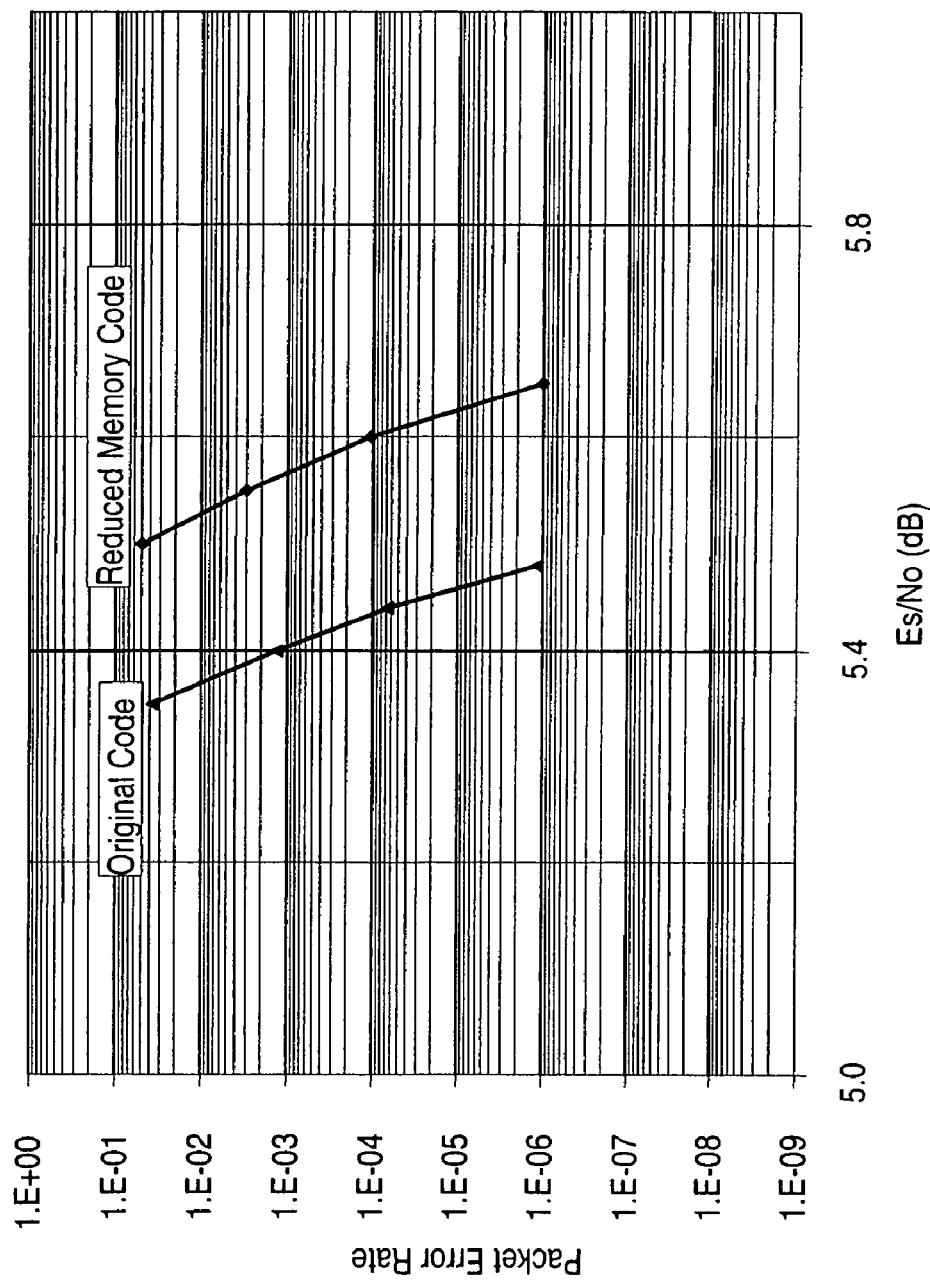
FIG. 7 is a graph showing performance of a baseline rate 3/5 LDPC code versus a reduced memory rate 3/5 LDPC code.
Figure 8:
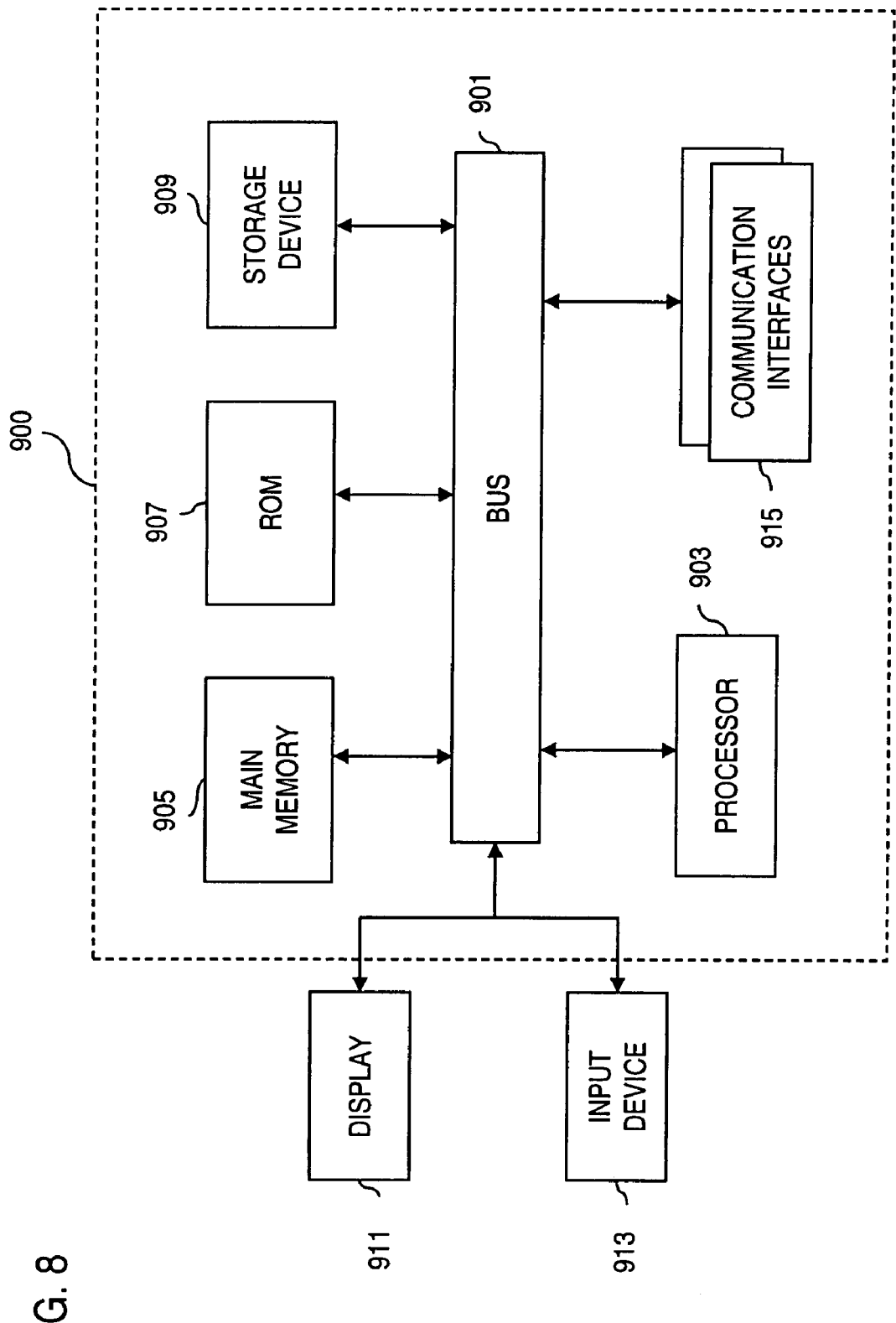
FIG. 8 is a diagram of a computing system that can perform the LDPC encoding process, in accordance with embodiments of the present invention.

FIG. 7 is a graph showing performance of a baseline rate 3/5 LDPC code versus a reduced memory rate 3/5 LDPC code. The graph compares a baseline LDPC code of rate 3/5 with that of the reduced memory rate 3/5 LDPC code. The DVB-S2 specified rate 3/5 LDPC code is used as the baseline.

The difference between the two codes are in the degree profile of bit nodes and check nodes. The DVB-S2 standard 3/5 rate code has 12960 bit nodes of degree 12, 25920 bit nodes of degree 3, 25919 bit nodes of degree 2, 1 bit node of degree 1; and 25919 check nodes of degree 11 and 1 check node of degree 10. The performance difference is a mere 0.17 dB between the standard 3/5 rate code and the reduced memory 3/5 rate code. For most applications, this "performance penalty" is acceptable, given the memory cost savings.

The LDPC encoding processes as detailed above can be executed through a variety of hardware and/or software configurations. In fact, this approach also can be readily deployed solely through a software change, thereby eliminating costly hardware modifications.

FIG. 9 illustrates exemplary hardware upon which an embodiment according to the present invention can be implemented. A computing system 900 includes a bus 901 or other communication mechanism for communicating information and a processor 903 coupled to the bus 901 for processing information. The computing system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions by the processor 903. The computing system 900 may further include a read only memory (ROM) 907 or other static storage device coupled to the bus 901 for storing static information and instructions for the processor 903. A storage device 909, such as a magnetic disk or optical disk, is coupled to the bus 901 for persistently storing information and instructions.

The computing system 900 may be coupled via the bus 901 to a display 911, such as a liquid crystal display, or active matrix display, for displaying information to a user. An input device 913, such as a keyboard including alphanumeric and other keys, may be coupled to the bus 901 for communicating information and command selections to the processor 903. The input device 913 can include a cursor control, such as a mouse, a trackball, or cursor direction keys, for communicating direction information and command selections to the processor 903 and for controlling cursor movement on the display 911.

According to one embodiment of the invention, the process of FIG. 2C can be provided by the computing system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement the embodiment of the present invention. In another example, reconfigurable hardware such as Field Programmable Gate Arrays (FPGAs) can be used, in which the functionality and connection topology of its logic gates are customizable at run-time, typically by programming memory look up tables. Thus, embodiments of the present invention are not limited to any specific combination of hardware circuitry and software.

The computing system 900 also includes at least one communication interface 915 coupled to bus 901. The communication interface 915 provides a two-way data communication coupling to a network link (not shown). The communication interface 915 sends and receives electrical, electromagnetic, or optical signals that carry digital data streams representing various types of information. Further, the communication interface 915 can include peripheral interface devices, such as a Universal Serial Bus (USB) interface, a PCMCIA (Personal Computer Memory Card International Association) interface, etc.

The processor 903 may execute code that is being received over the communication interface 915 and/or store the code in the storage device 909, or other non-volatile storage for later execution. In this manner, the computing system 900 may obtain application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as the storage device 909. Volatile media include dynamic memory, such as main memory 905. Transmission media include coaxial cables, copper wire and fiber optics, including the wires that comprise the bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

Accordingly, the various embodiments of the present invention provide an LDPC encoder generates a LDPC code having an outer Bose Chaudhuri Hocquenghem (BCH) code according to Table 1, which specifies the address of parity bit accumulators, for transmission as a LDPC coded signal. In particular, for the rate 3/5 LDPC code, the code design of Table 1 provides for reduced memory requirements vis-à-vis the unmodified rate 3/5 LDPC code. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method comprising:
generating, based on information bits, parity bits of a Low Density Parity Check (LDPC) code according to a code rate of 3/5 by accumulating bits at parity bit addresses according to $\{x+m \mod 360 \times q\} \mod(n_{ldpc}-k_{ldpc})$, where $n_{ldpc}$ is the codeword size, $k_{ldpc}$ is the information block size, m is an integer corresponding to a particular information bit, q is the code rate, and x denotes the address of the parity bit accumulator as specified by respective tables using parity bit accumulators,

| Address of Parity Bit Accumulators (Rate 3/5) |
|---|
| 22407 10271 11614 19944 11218 2914 3149 73 |
| 15405 9692 9911 3315 343 22463 11100 12704 |
| 22561 17290 22501 6471 6935 8761 13279 8911 |
| 11053 22855 25752 14337 5499 19226 8772 2187 |
| 7750 7477 6155 7039 15401 20623 11950 16146 |
| 25376 5191 15926 21804 17531 11820 21622 12048 |
| 16555 14530 7636 10699 17439 11098 5675 14131 |
| 10381 22342 15382 7062 17440 13122 14500 24536 |
| 1041 15025 25372 14243 24448 21620 23701 7474 |
| 18504 22194 20916 8948 5461 15657 6146 21549 |
| 24143 2676 23993 24376 22472 10350 1079 12342 |
| 23825 9004 25634 16833 5736 18814 11600 5591 |
| 21494 24795 6352 17362 7102 13903 3993 16495 |
| 11561 15038 23349 503 3497 11202 15418 16076 |
| 22528 2432 19064 2934 21660 1911 7499 5616 |
| 7283 16543 13866 6723 8888 18245 16962 1743 |
| 2727 16421 728 10651 7012 9191 10149 9106 |
| 13005 10331 15275 3145 13413 12800 17139 4932 |
| 4504 15820 24833 17200 14077 4993 9788 6653 |
| 18224 11374 9038 4713 510 9369 7421 8337 |
| 23906 18930 7269 12514 4373 20020 6164 21016 |
| 4406 8242 22946 25140 10353 5300 14809 5808 |
| 15911 16437 15764 17765 17427 9495 8358 4961 |
| 2131 12908 5343 14758 14678 7988 20631 4357 |
| 24002 10014 11034 3773 24265 8059 19802 854 |
| 23920 10497 19268 17515 6333 7787 17171 17614 |
| 15810 7467 23718 3651 24578 16552 17557 22433 |
| 20507 4411 24872 11006 17541 15667 15278 4243 |
| 24148 10488 8501 23359 4030 1418 4442 23299 |
| 16584 8067 24762 3645 25884 8712 9585 20358 |
| 10710 6116 24519 7728 19963 24989 23944 13660 |
| 18708 145 3901 22948 16454 17670 15352 18189 |
| 3218 11549 18170 12733 18733 5705 14682 17199 |
| 14921 11190 25097 23569 86 4804 10478 22553 |
| 657 53 15215 15049 13307 2328 19535 21435 |
| 19767 2988 16855 4858 23970 15171 724 23353 |
| 0 19274 20228 |
| 1 13271 1515 |
| 2 10864 476 |
| 3 4787 21317 |
| 4 2609 15664 |
| 5 23875 22477 |
| 6 9537 18270 |
| 7 12039 16705 |
| 8 15180 18317 |
| 9 10133 6682 |
| 10 10203 5671 |
| 11 12482 13992 |
| 12 19116 1725 |
| 13 17558 16333 |
| 14 7932 18883 |
| 15 23346 6770 |
| 16 5049 15145 |
| 17 6960 8821 |
| 18 10686 16411 |
| 19 14276 4043 |
| 20 6988 1073 |
| 21 20504 4318 |
| 22 14806 18855 |
| 23 23408 2829 |
| 24 22876 24662 |
| 25 14159 10002 |
| 26 8898 25354 |
| 27 5936 1007 |
| 28 16162 7228 |
| 29 23710 23342 |
| 30 23745 16423 |
| 31 13336 18903 |
| 32 10697 8815 |
| 33 6198 6723 |
| 34 2880 20781 |
| 35 1185724611 |
| 36 8005 2292 |
| 37 24679 6248 |
| 38 21841 20646 |
| 39 11296 9870 |
| 40 21935 16106 |
| 41 10983 18735 |
| 42 12821 12188 |
| 43 13941 10895 |
| 44 5712 19077 |
| 45 6437 11275 |
| 46 10827 11446 |
| 47 14047 13073 |
| 48 1503 19612 |
| 49 17944 1338 |
| 50 11235 24946 |
| 51 19170 7268 |
| 52 2913 2560 |
| 53 17734 7765 |
| 54 9625 22307 |
| 55 17651 16905 |
| 56 300 3636 |
| 57 1526 23116 |
| 58 17733 2448 |
| 59 14977 13008 |
| 60 11946 12026 |
| 61 8819 8702 |
| 62 11906 4819 |
| 63 2629 12075 |
| 64 4854 5201 |
| 65 13627 18773 |
| 66 18658 12753 |
| 67 24872 8887 |
| 68 3455 8326 |
| 69 10772 3134 |
| 70 21514 18584 |
| 71 15689 18484. |

2. A method according to claim 1, wherein parity bits, $p_i$, are determined according to $p_i = p_i \oplus p_{i-1}$, i=1,2, . . . ,$n_{ldpc} - k_{ldpc} - 1$.

3. A method according to claim 1, wherein a Bose Chaudhuri Hocquenghem (BCH) outer code is used based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

4. A method according to claim 1, wherein the LDPC code is transmitted over a satellite link in support of a broadband satellite application.

5. A method according to claim 4, wherein the LDPC code represents digitized video signals.

6. A method according to claim 5, wherein the video signals conform with MPEG (Motion Pictures Expert Group) packet transmission.

7. A computer-readable medium bearing instructions for encoding, said instructions, being arranged, upon execution, to cause one or more processors to perform the method of claim 1.

8. An apparatus comprising:
logic configured to generate, based on information bits, parity bits of a Low Density Parity Check (LDPC) code according to a code rate of 3/5 by accumulating bits at parity bit addresses according to $\{x+m \bmod 360 \times q\} \bmod(n_{ldpc}-k_{ldpc})$, where $n_{ldpc}$ is the codeword size, $k_{ldpc}$ is the information block size, m is an integer corresponding to a particular information bit, q is the code rate, and x denotes the address of the parity bit accumulator as specified by respective tables using parity bit accumulators,

| Address of Parity Bit Accumulators (Rate 3/5) |
| --- |
| 22407 10271 11614 19944 11218 2914 3149 73 |
| 15405 9692 9911 3315 343 22463 11100 12704 |
| 22561 17290 22501 6471 6935 8761 13279 8911 |
| 11053 22855 25752 14337 5499 19226 8772 2187 |
| 7750 7477 6155 7039 15401 20623 11950 16146 |
| 25376 5191 15926 21804 17531 11820 21622 12048 |
| 16555 14530 7636 10699 17439 11098 5675 14131 |
| 10381 22342 15382 7062 17440 13122 14500 24536 |
| 1041 15025 25372 14243 24448 21620 23701 7474 |
| 18504 22194 20916 8948 5461 15657 6146 21549 |
| 24143 2676 23993 24376 22472 10350 1079 12342 |
| 23825 9004 25634 16833 5736 18814 11600 5591 |
| 21494 24795 6352 17362 7102 13903 3993 16495 |
| 11561 15038 23349 503 3497 11202 15418 16076 |
| 22528 2432 19064 2934 21660 1911 7499 5616 |
| 7283 16543 13866 6723 8888 18245 16962 1743 |
| 2727 16421 728 10651 7012 9191 10149 9106 |
| 13005 10331 15275 3145 13413 12800 17139 4932 |
| 4504 15820 24833 17200 14077 4993 9788 6653 |
| 18224 11374 9038 4713 510 9369 7421 8337 |
| 23906 18930 7269 12514 4373 20020 6164 21016 |
| 4406 8242 22946 25140 10353 5300 14809 5808 |
| 15911 16437 15764 17765 17427 9495 8358 4961 |
| 2131 12908 5343 14758 14678 7988 20631 4357 |
| 24002 10014 11034 3773 24265 8059 19802 854 |
| 23920 10497 19268 17515 6333 7787 17171 17614 |
| 15810 7467 23718 3651 24578 16552 17557 22433 |
| 20507 4411 24872 11006 17541 15667 15278 4243 |
| 24148 10488 8501 23359 4030 1418 4442 23299 |
| 16584 8067 24762 3645 25884 8712 9585 20358 |
| 10710 6116 24519 7728 19963 24989 23944 13660 |
| 18708 145 3901 22948 16454 17670 15352 18189 |
| 3218 11549 18170 12733 18733 5705 14682 17199 |
| 14921 11190 25097 23569 86 4804 10478 22553 |
| 657 53 15215 15049 13307 2328 19535 21435 |
| 19767 2988 16855 4858 23970 15171 724 23353 |
| 0 19274 20228 |
| 1 13271 1515 |
| 2 10864 476 |
| 3 4787 21317 |
| 4 2609 15664 |
| 5 23875 22477 |
| 6 9537 18270 |
| 7 12039 16705 |
| 8 15180 18317 |
| 9 10133 6682 |
| 10 10203 5671 |
| 11 12482 13992 |
| 12 19116 1725 |
| 13 17558 16333 |
| 14 7932 18883 |
| 15 23346 6770 |
| 16 5049 15145 |
| 17 6960 8821 |
| 18 10686 16411 |
| 19 14276 4043 |
| 20 6988 1073 |
| 21 20504 4318 |
| 22 14806 18855 |
| 23 23408 2829 |
| 24 22876 24662 |
| 25 14159 10002 |
| 26 8898 25354 |
| 27 5936 1007 |
| 28 16162 7228 |
| 29 23710 23342 |
| 30 23745 16423 |
| 31 13336 18903 |
| 32 10697 8815 |
| 33 6198 6723 |
| 34 2880 20781 |
| 35 11857 24611 |
| 36 8005 2292 |
| 37 24679 6248 |
| 38 21841 20646 |
| 39 11296 9870 |
| 40 21935 16106 |
| 41 10983 18735 |
| 42 12821 12188 |
| 43 13941 10895 |
| 44 5712 19077 |
| 45 6437 11275 |
| 46 10827 11446 |
| 47 14047 13073 |
| 48 1503 19612 |
| 49 17944 1338 |
| 50 11235 24946 |
| 51 19170 7268 |
| 52 2913 2560 |
| 53 17734 7765 |
| 54 9625 22307 |
| 55 17651 16905 |
| 56 300 3636 |
| 57 1526 23116 |
| 58 17733 2448 |
| 59 14977 13008 |
| 60 11946 12026 |
| 61 8819 8702 |
| 62 11906 4819 |
| 63 2629 12075 |
| 64 4854 5201 |
| 65 13627 18773 |
| 66 18658 12753 |
| 67 24872 8887 |
| 68 3455 8326 |
| 69 10772 3134 |
| 70 21514 18584 |
| 71 15689 18484. |

9. An apparatus according to claim 8, wherein parity bits, $p_i$, are determined according to $p_i = p_i \oplus p_{i-1}$, $i=1,2,\ldots,n_{ldpc}-k_{ldpc}-1$.

10. An apparatus according to claim 8, wherein a Bose Chaudhuri Hocquenghem (BCH) outer code is used based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4+x^{11}+x^{12}+x^{14})\times(1+x+x^2+x^3+x^5+x^6+x^7+x^8+x^{10}+x^{13}+x^{14}).$$

11. An apparatus according to claim 8, wherein the LDPC code is transmitted over a satellite link in support of a broadband satellite application.

12. An apparatus according to claim 11, wherein the LDPC code represents digitized video signals.

13. An apparatus according to claim 12, wherein the video signals conform with MPEG (Motion Pictures Expert Group) packet transmission.

14. A system comprising:
a Low Density Parity Check (LDPC) encoder configured to output, based on received information bits, an LDPC code; and
a Bose Chaudhuri Hocquenghem (BCH) encoder coupled to the LDPC encoder and configured to provide an outer code to the LDPC code, wherein the LDPC code is generated according to a code rate of 3/5 associated with a table specifying address of parity bit accumulators according to {x+m mod 360×q} mod($n_{ldpc}$−$k_{ldpc}$), where $n_{ldpc}$ is the codeword size, $k_{ldpc}$ is the information block size, m is an integer corresponding to a particular information bit, q is the code rate, and x denotes the address of the parity bit accumulator,

| Address of Parity Bit Accumulators (Rate 3/5) |
| --- |
| 22407 10271 11614 19944 11218 2914 3149 73 |
| 15405 9692 9911 3315 343 22463 11100 12704 |
| 22561 17290 22501 6471 6935 8761 13279 8911 |
| 11053 22855 25752 14337 5499 19226 8772 2187 |
| 7750 7477 6155 7039 15401 20623 11950 16146 |
| 25376 5191 15926 21804 17531 11820 21622 12048 |
| 16555 14530 7636 10699 17439 11098 5675 14131 |
| 10381 22342 15382 7062 17440 13122 14500 24536 |
| 1041 15025 25372 14243 24448 21620 23701 7474 |
| 18504 22194 20916 8948 5461 15657 6146 21549 |
| 24143 2676 23993 24376 22472 10350 1079 12342 |
| 23825 9004 25634 16833 5736 18814 11600 5591 |
| 21494 24795 6352 17362 7102 13903 3993 16495 |
| 11561 15038 23349 503 3497 11202 15418 16076 |
| 22528 2432 19064 2934 21660 1911 7499 5616 |
| 7283 16543 13866 6723 8888 18245 16962 1743 |
| 2727 16421 728 10651 7012 9191 10149 9106 |
| 13005 10331 15275 3145 13413 12800 17139 4932 |
| 4504 15820 24833 17200 14077 4993 9788 6653 |
| 18224 11374 9038 4713 510 9369 7421 8337 |
| 23906 18930 7269 12514 4373 20020 6164 21016 |
| 4406 8242 22946 25140 10353 5300 14809 5808 |
| 15911 16437 15764 17765 17427 9495 8358 4961 |
| 2131 12908 5343 14758 14678 7988 20631 4357 |
| 24002 10014 11034 3773 24265 8059 19802 854 |
| 23920 10497 19268 17515 6333 7787 17171 17614 |
| 15810 7467 23718 3651 24578 16552 17557 22433 |
| 20507 4411 24872 11006 17541 15667 15278 4243 |
| 24148 10488 8501 23359 4030 1418 4442 23299 |
| 16584 8067 24762 3645 25884 8712 9585 20358 |
| 10710 6116 24519 7728 19963 24989 23944 13660 |
| 18708 145 3901 22948 16454 17670 15352 18189 |
| 3218 11549 18170 12733 18733 5705 14682 17199 |
| 14921 11190 25097 23569 86 4804 10478 22553 |
| 657 53 15215 15049 13307 2328 19535 21435 |
| 19767 2988 16855 4858 23970 15171 724 23353 |
| 0 19274 20228 |
| 1 13271 1515 |
| 2 10864 476 |
| 3 4787 21317 |
| 4 2609 15664 |
| 5 23875 22477 |
| 6 9537 18270 |
| 7 12039 16705 |
| 8 15180 18317 |
| 9 10133 6682 |
| 10 10203 5671 |
| 11 12482 13992 |
| 12 19116 1725 |
| 13 17558 16333 |
| 14 7932 18883 |
| 15 23346 6770 |
| 16 5049 15145 |
| 17 6960 8821 |
| 18 10686 16411 |
| 19 14276 4043 |
| 20 6988 1073 |
| 21 20504 4318 |
| 22 14806 18855 |

| Address of Parity Bit Accumulators (Rate 3/5) |
| --- |
| 23 23408 2829 |
| 24 22876 24662 |
| 25 14159 10002 |
| 26 8898 25354 |
| 27 5936 1007 |
| 28 16162 7228 |
| 29 23710 23342 |
| 30 23745 16423 |
| 31 13336 18903 |
| 32 10697 8815 |
| 33 6198 6723 |
| 34 2880 20781 |
| 35 11857 24611 |
| 36 8005 2292 |
| 37 24679 6248 |
| 38 21841 20646 |
| 39 11296 9870 |
| 40 21935 16106 |
| 41 10983 18735 |
| 42 12821 12188 |
| 43 13941 10895 |
| 44 5712 19077 |
| 45 6437 11275 |
| 46 10827 11446 |
| 47 14047 13073 |
| 48 1503 19612 |
| 49 17944 1338 |
| 50 11235 24946 |
| 51 19170 7268 |
| 52 2913 2560 |
| 53 17734 7765 |
| 54 9625 22307 |
| 55 17651 16905 |
| 56 300 3636 |
| 57 1526 23116 |
| 58 17733 2448 |
| 59 14977 13008 |
| 60 11946 12026 |
| 61 8819 8702 |
| 62 11906 4819 |
| 63 2629 12075 |
| 64 4854 5201 |
| 65 13627 18773 |
| 66 18658 12753 |
| 67 24872 8887 |
| 68 3455 8326 |
| 69 10772 3134 |
| 70 21514 18584 |
| 71 15689 18484. |

15. An apparatus according to claim 14, wherein parity bits, $p_i$, are determined according to $p_i = p_i \oplus p_{i-1}$, i=1,2, . . . , $n_{ldpc}$−$k_{ldpc}$−1.

16. An apparatus according to claim 14, wherein a Bose Chaudhuri Hocquenghem (BCH) outer code is used based on a generator polynomial of:

$$g(x)=(1+x+x^3+x^5+x^{14})\times(1+x^6+x^8+x^{11}+x^{14})\times(1+x+x^2+x^6+x^9+x^{10}+x^{14})\times(1+x^4+x^7+x^8+x^{10}+x^{12}+x^{14})\times(1+x^2+x^4+x^6+x^8+x^9+x^{11}+x^{13}+x^{14})\times(1+x^3+x^7+x^8+x^9+x^{13}+x^{14})\times(1+x^2+x^5+x^6+x^7+x^{10}+x^{11}+x^{13}+x^{14})\times(1+x^5+x^8+x^9+x^{10}+x^{11}+x^{14})\times(1+x+x^2+x^3+x^9+x^{10}+x^{14})\times(1+x^3+x^6+x^9+x^{11}+x^{12}+x^{14})\times(1+x^4\times x^{11}+x^{12}+x^{14})\times(1+x+x^2+x^3+x^5+x^6+x^7+x^8+x^{10}+x^{13}+x^{14}).$$

17. A system according to claim 14, wherein the LDPC code is transmitted over a satellite link in support of a broadband satellite application.

18. A system according to claim 3, wherein the LDPC code represents digitized video signals.

19. A system according to claim 17, wherein the video signals conform with MPEG (Motion Pictures Expert Group) packet transmission.

* * * * *